US012707940B2

(12) United States Patent
Yang et al.

(10) Patent No.: US 12,707,940 B2
(45) Date of Patent: Aug. 11, 2026

(54) DEFECT INSPECTION SYSTEM EMPLOYING AN IMAGE ENHANCING MODEL AND A DEFECT DETECTION MODEL, AND METHOD OF USING THE SAME

(71) Applicant: Taiwan Semiconductor Manufacturing Co., Ltd., Hsinchu (TW)

(72) Inventors: Chih-Kai Yang, Taipei (TW); Tung-Chin Wu, Hsinchu (TW); Yu-Tien Shen, Tainan (TW); Hsiang Ming Chang, Hsinchu (TW); Chun-Yen Chang, Hsinchu (TW); Ya Hui Chang, Hsinchu (TW); Zengqin Zhao, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 631 days.

(21) Appl. No.: 17/650,723

(22) Filed: Feb. 11, 2022

(65) Prior Publication Data

US 2023/0049405 A1 Feb. 16, 2023

Related U.S. Application Data

(60) Provisional application No. 63/232,751, filed on Aug. 13, 2021.

(51) Int. Cl.
*H10P 74/20* (2026.01)
*G01N 21/95* (2006.01)
(Continued)

(52) U.S. Cl.
CPC ....... *H10P 74/203* (2026.01); *G01N 21/9501* (2013.01); *G06T 1/0007* (2013.01);
(Continued)

(58) Field of Classification Search
CPC ..... H01L 22/12; H01L 21/475; H01L 21/033; G01N 21/9501; G01N 2021/8887;
(Continued)

(56) References Cited

U.S. PATENT DOCUMENTS

2017/0161884 A1* 6/2017 Chen ................ G06V 30/19173
2019/0303717 A1* 10/2019 Bhaskar ................ G06F 18/214
(Continued)

OTHER PUBLICATIONS

Ledig, Christian et al., "Photo-Realistic Single Image Super-Resolution Using a Generative Adversarial Network," May 25, 2017, pp. 1-19.
(Continued)

*Primary Examiner* — Hwa Andrew Lee
(74) *Attorney, Agent, or Firm* — Slater Matsil, LLP

(57) ABSTRACT

A method includes patterning a hard mask over a target layer, capturing a low resolution image of the hard mask, and enhancing the low resolution image of the hard mask with a first machine learning model to produce an enhanced image of the hard mask. The method further includes analyzing the enhanced image of the hard mask with a second machine learning model to determine whether the target layer has defects.

17 Claims, 15 Drawing Sheets

(51) Int. Cl.
*G06T 1/00* (2006.01)
*G06T 7/00* (2017.01)
*H10P 14/61* (2026.01)
*G01N 21/88* (2006.01)

(52) U.S. Cl.
CPC ............ *G06T 7/0006* (2013.01); *H10P 14/61* (2026.01); *G01N 2021/8887* (2013.01); *G06T 2207/20081* (2013.01); *G06T 2207/30148* (2013.01)

(58) Field of Classification Search
CPC ................. G06T 1/0007; G06T 7/0006; G06T 2207/20081; G06T 2207/30148; G06T 7/0004; G06T 2207/20084; G06T 3/4053; G06T 3/4046
See application file for complete search history.

(56) References Cited

U.S. PATENT DOCUMENTS

2021/0232745 A1 7/2021 Chou et al.
2023/0049405 A1* 2/2023 Yang ................. G01N 21/9501

OTHER PUBLICATIONS

Lin, CW, "Generative Adversarial Network and Super Resolution GAN(SRGAN)," Apr. 24, 2020, pp. 1-11.
Liu, Tairan et al., "Deep Learning-Based Super-Resolution in Coherent Imaging Systems," Scientific Reports, Feb. 19, 2019, pp. 1-13.
Yang, Wenming et al., "Deep Learning for Single Image Super-Resolution: A Brief Review," Jul. 12, 2019, pp. 1-16.

* cited by examiner

DEFECT INSPECTION SYSTEM EMPLOYING AN IMAGE ENHANCING MODEL AND A DEFECT DETECTION MODEL, AND METHOD OF USING THE SAME

PRIORITY CLAIM AND CROSS-REFERENCE

This application claims the benefit of U.S. Provisional Application No. 63/232,751, filed on Aug. 13, 2021, which application is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs. In the course of integrated circuit evolution, functional density (such as the number of interconnected devices per chip area) has generally increased while geometry size (such as the smallest component that can be created using a fabrication process) has decreased. This scaling down process generally provides benefits by increasing production efficiency and lowering associated costs. As a part of the IC fabrication process, wafers may be inspected for potential defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
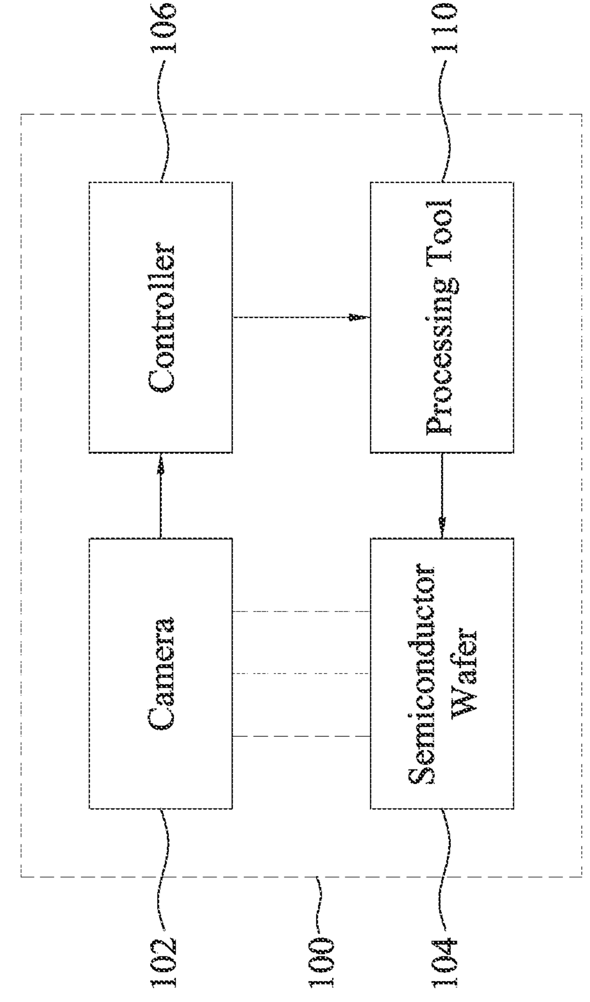
FIG. 1 is a block diagram of a semiconductor processing apparatus, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a semiconductor processing apparatus captures low resolution images of semiconductor wafers, and enhances the images to perform defect inspection of features on the semiconductor wafers. An image enhancing model including one or more neural network(s) is trained to enhance low resolution images of semiconductor wafers using a first deep learning-based process. The deep learning-based process trains the image enhancing model to enhance low resolution images using high resolution test images and low resolution test images. A defect detection model is trained using a second deep learning-based process to analyze for defects in enhanced images produced by the image enhancing model. The image enhancing model and defect detection model are used to inspect semiconductor wafers for defects. Capturing low resolution images may allow for a larger field-of-view (FOV), as compared to capturing high resolution images. Using the image enhancing model to enhance low resolution images enables the use of images with a larger field-of-view (FOV) in the defect inspection process without a corresponding loss in accuracy due to the lower resolution of the images. This decreases the defect inspection time and increases throughput, reducing processing costs by increasing throughput.

FIG. 1 is a block diagram of a semiconductor processing apparatus 100, in accordance with some embodiments. The semiconductor processing apparatus 100 includes a camera 102, a controller 106, and a processing tool 110. The components of the semiconductor processing apparatus 100 work together to perform a semiconductor process on a semiconductor wafer 104 and analyze the semiconductor wafer 104 for defects. During inspection, the camera 102 captures low resolution images of the semiconductor wafer 104, the controller 106 enhances the low resolution images of the semiconductor wafer 104, and the controller 106 analyzes for defects in the semiconductor wafer 104 using the enhanced images.

The camera 102 is configured to capture images of the semiconductor wafer 104. In some embodiments, the camera 102 includes an electron beam inspection system, a scanning electron microscope, an atomic force microscope imaging system, an optical scanning system (e.g., a deep ultraviolet laser inspection system), or the like, which is operable to capture images of the semiconductor wafer 104. Other acceptable types of camera may be utilized.

The processing tool 110 is configured to perform one or more of a large number of semiconductor processes on the semiconductor wafer 104, such as photolithography processes, etching processes, deposition processes (e.g., thin-film deposition processes), planarization processes, doping processes, annealing processes, and other types of processes. For example, the processing tool 110 may include an etcher, an implanter, a deposition system, a photolithography system, or the like. The semiconductor processes can be used in a front-end of line (FEOL) process to form devices such as transistors (e.g., FinFETs; see below, FIG. 8), in a back-end of line (BEOL) process to form interconnect structures for transistors (see below, FIG. 9), or the like.

In one example, the processing tool 110 is utilized to perform one or more process in a series of semiconductor processes to form patterned features on a substrate. Accordingly, the semiconductor processes may include forming a target layer over the semiconductor wafer 104, depositing a hard mask layer over the target layer, and patterning the hard mask layer to form a patterned hard mask. The semiconductor processes may further include etching the target layer using the patterned hard mask as an etching mask, thereby forming patterned features from the target layer. The patterned features (e.g., semiconductor strips, conductive lines, etc.) have the pattern of the hard mask. The hard mask is then removed, leaving the patterned features.

The controller 106 is configured to receive images from the camera 102, and to control the processing tool 110. The controller 106 is connected to the camera 102 and to the processing tool 110. The controller 106 may be implemented in either hardware or software, and the parameters may be hardcoded or input to the controller 106 through an input device. For example, the controller 106 may be a circuit such as an application-specific integrated circuit (ASIC), a field programmable gate array (FPGA), or the like. The controller 106 may also include a processor operable to execute programming. In some embodiments, the controller 106 comprises one or more programmable computer(s), and the methods described herein are implemented as programming executed by a processor. The controller 106 is illustrated as a single element for illustrative purposes. In some embodiments, the controller 106 comprises multiple elements. The controller 106 is further configured to enhance low resolution images of the semiconductor wafer 104 with an image enhancing system (see below, FIG. 10) and to analyze for defects in the semiconductor wafer 104 using the enhanced images with a defect detection system (see below, FIG. 11). The controller 106 may include storage (e.g., volatile or non-volatile memory) for storing images and machine learning models which will be used for defect identification.

After one or more semiconductor processes have been performed on the semiconductor wafer 104, it can be beneficial to inspect the semiconductor wafer 104 for defects. Inspection can help ensure that the processes performed by the processing tool 110 have accomplished their intended purpose. If defects are identified, then further processing of the semiconductor wafer 104 may be halted to reduce manufacturing costs, and the processes (e.g., parameters associated with the processes), may be adjusted to reduce the formation of defects in the future. If no defects are identified, then the processes may be assumed to be functioning properly and may not need to be adjusted.

Figure 2:
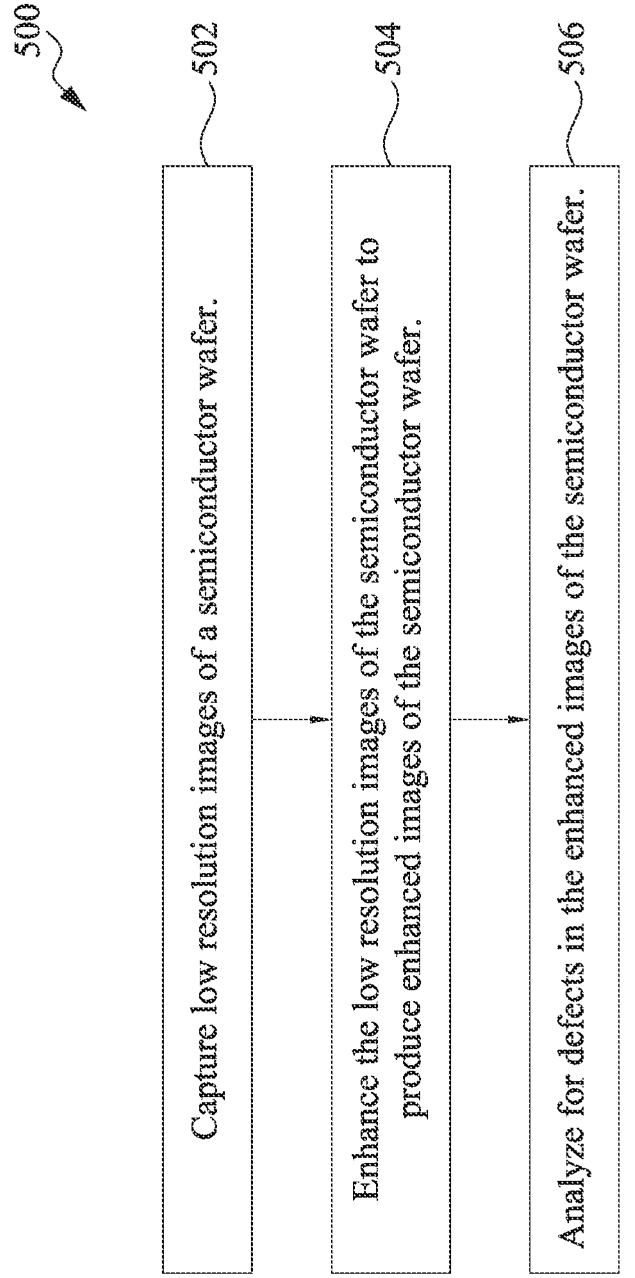
FIG. 2 is a flow chart of a method for detecting defects on a semiconductor wafer, in accordance with some embodiments.

FIG. 2 illustrates a flow chart of a method 500 for inspecting a semiconductor wafer for defects. In step 502, a camera is used to capture low resolution images of regions of the semiconductor wafer. As will be subsequently described in greater detail, the images captured by the camera 102 are low resolution images which are subsequently enhanced. The camera 102 can capture images of the semiconductor wafer 104 between semiconductor processing steps, e.g., after a hard mask is patterned. The images captured by the camera 102 can be utilized to analyze for defects in the semiconductor wafer 104, such as pattern bridging defects (e.g., undesirable bridging in the patterns of the semiconductor wafer 104). The camera 102 captures images of the various regions of the semiconductor wafer 104.

In step 504, an image enhancing model is used to enhance the low resolution images of the regions of the semiconductor wafer captured by the camera to produce enhanced images of the semiconductor wafer. The resulting enhanced images are high resolution images corresponding to the low resolution images. The image enhancing model may include a machine learning model, e.g., a generative adversarial network (GAN). As will be subsequently described in greater detail, the machine learning model may be trained with a deep learning-based process using high resolution test images and low resolution test images, so that the machine learning model is capable of more accurately enhancing the low resolution image. The low resolution images of the regions of the semiconductor wafer are enhanced by the image enhancing model in order to resolve defects in the images with greater accuracy. Capturing low resolution images may allow for a larger field-of-view (FOV) during inspection, as compared to capturing high resolution images. Using an image enhancing model to enhance low resolution images for inspection of the semiconductor wafer (rather than capturing high resolution images for inspection of the semiconductor wafer) thus allows for a larger field-of-view (FOV) in the defect inspection process without a corresponding loss in accuracy due to the lower resolution of the images. Increasing the FOV allows the quantity of captured images to be decreased, thereby increasing inspection throughput.

In step 506, a defect detection model is used to analyze for defects in the enhanced images provided by the image enhancing model. Specifically, the enhanced images are analyzed to determine whether the semiconductor wafer has defects. The defect detection model may include a machine learning model, e.g., a convolutional neural network (CNN). As will be subsequently described in greater detail, the machine learning model may be trained by a deep learning-based process to analyze for defects using high resolution test images of regions having defects and low resolution test images of the same regions which have been enhanced by the image enhancing model. The defect detection model can identify defects in the enhanced images with comparable accuracy as the identification of defects in high resolution images.

Figure 3:
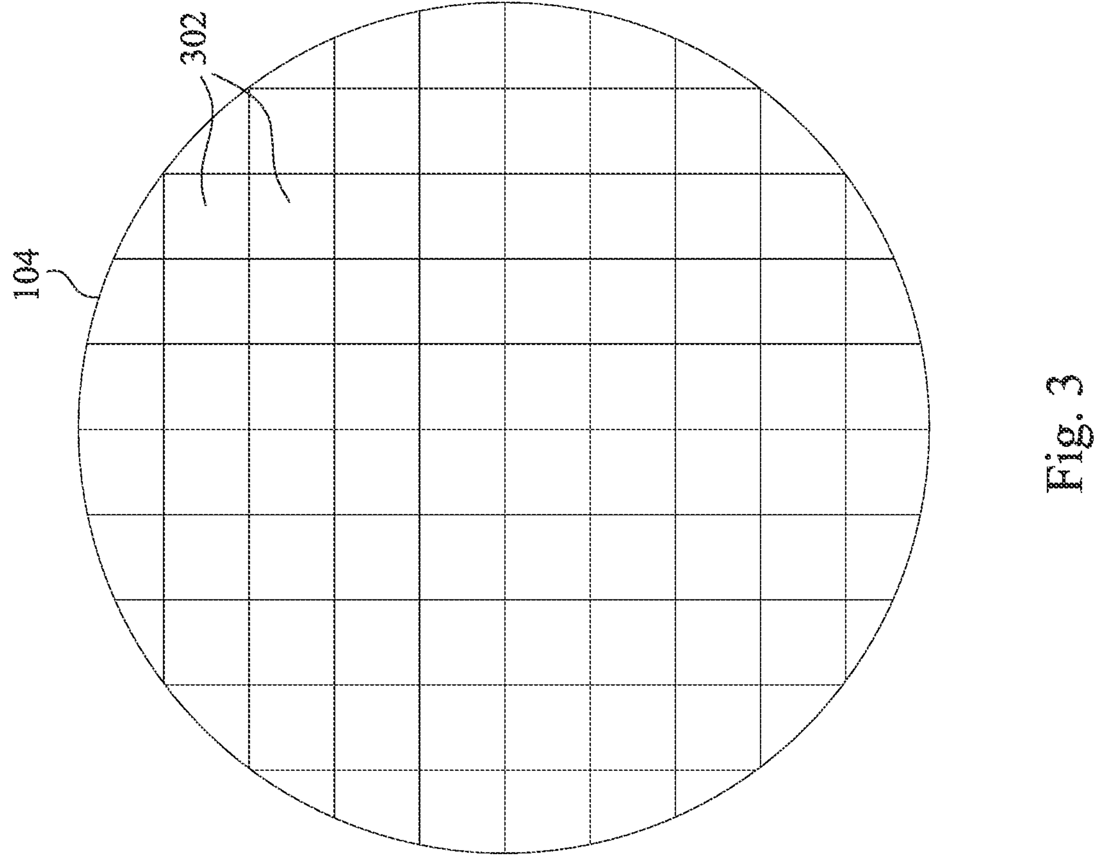
FIG. 3 illustrates a top view of a semiconductor wafer, in accordance with some embodiments.

FIG. 3 illustrates a semiconductor wafer 104, in accordance with some embodiments. The illustration of FIG. 3 shows that the semiconductor wafer 104 is divided into a plurality of regions 302. The camera 102 (see FIG. 1) can capture images of the regions 302. Alternatively, the camera 102 may capture images of only selected regions 302. The semiconductor wafer 104 may include any desired quantity of regions 302, including more or fewer regions 302 than shown in FIG. 3. The images may be captured over the semiconductor wafer 104 with different resolutions. Low resolution images have a smaller number of pixels than high resolution images at the same FOV and magnification factor. In some embodiments, each image captures a region 302 in a range of 0.25 $\mu m^2$ to 1.0 $\mu m^2$ in area. As an example, the images can have a FOV of 540 nm by 540 nm. As another example, images can have a FOV of 1080 nm by 1080 nm. The images can be captured with lower or higher resolutions having smaller or greater numbers of pixels, respectively. For example, low resolution images can have an arrangement of 512 pixels by 512 pixels and high resolution images can have an arrangement of 1024 pixels by 1024 pixels. In some embodiments, low resolution images have a pixel-to-length ratio of about 1.9 pixels/nm and high resolution images have a pixel-to-length ratio of about 0.95 pixels/nm.

Figure 4B:
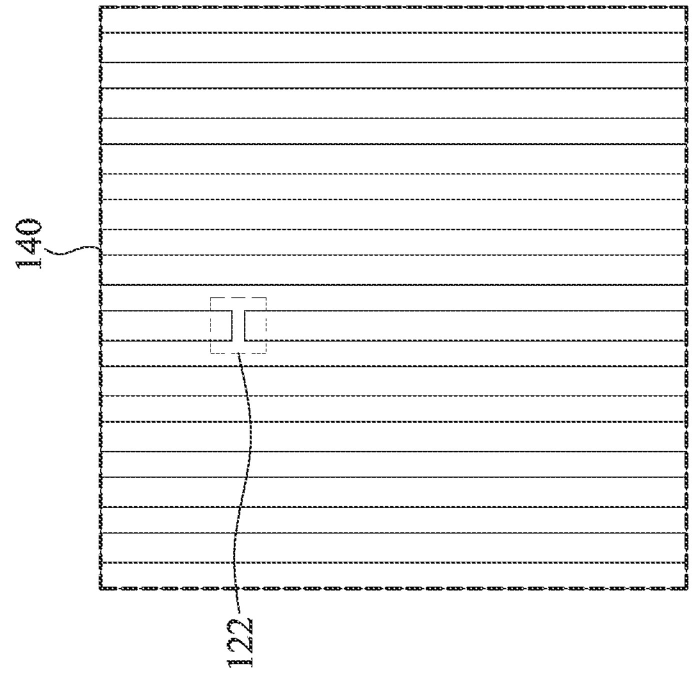
FIGS. 4A and 4B are images of regions of a semiconductor wafer, in accordance with some embodiments.
Figure 4A:
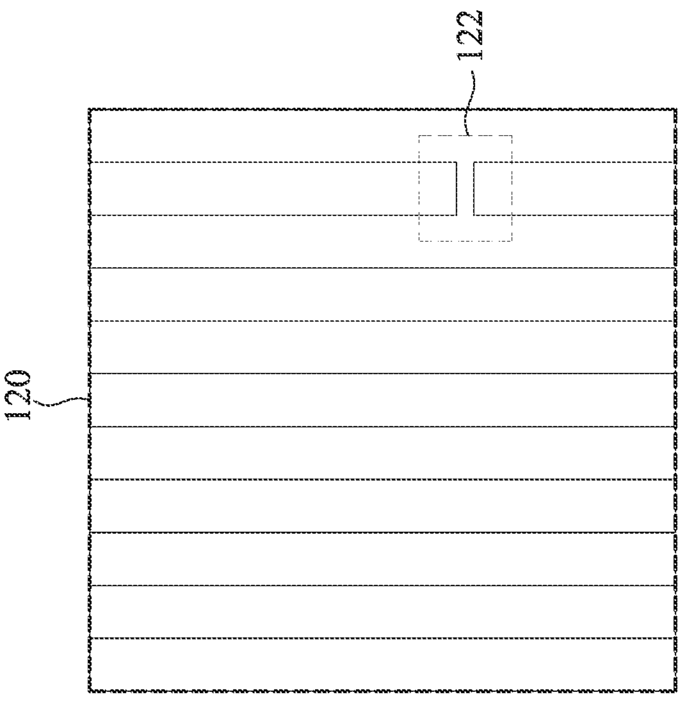

FIGS. 4A and 4B illustrate example images (e.g., by the camera 102; see above, FIG. 1) of a region 302 of the semiconductor wafer 104 (see above, FIG. 3) in order to inspect for defects 122. FIG. 4A illustrates a high resolution image 120 of a region 302, and FIG. 4B illustrates a low resolution image 140 of a region 302. The low resolution image 140 has a larger FOV than the high resolution image 120, and encompasses the FOV of the high resolution image 120. Thus, the low resolution image 140 encompasses a larger region 302 than the high resolution image 120, and so fewer regions 302 need to be imaged during inspection. In some embodiments, the high resolution image 120 and the low resolution image 140 are images of a hard mask layer over a target layer. However, the high resolution image 120 and the low resolution image 140 may be captured at any suitable stage of processing. In the illustrated examples of FIGS. 4A and 4B, a defect 122 (e.g., a pattern bridging defect) is present in the high resolution image 120 and the low resolution image 140.

Figure 5:
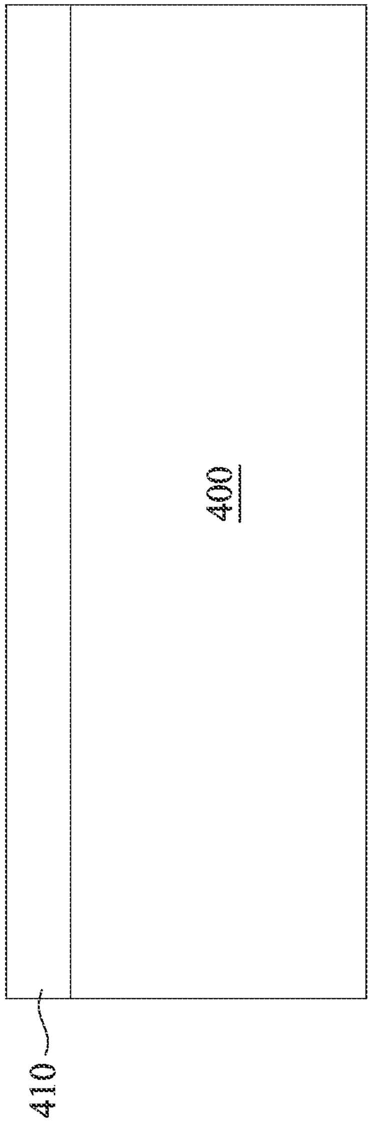
FIGS. 5, 6, and 7 are cross-sectional views of intermediate stages in the manufacturing of a semiconductor device, in accordance with some embodiments.
Figure 6:
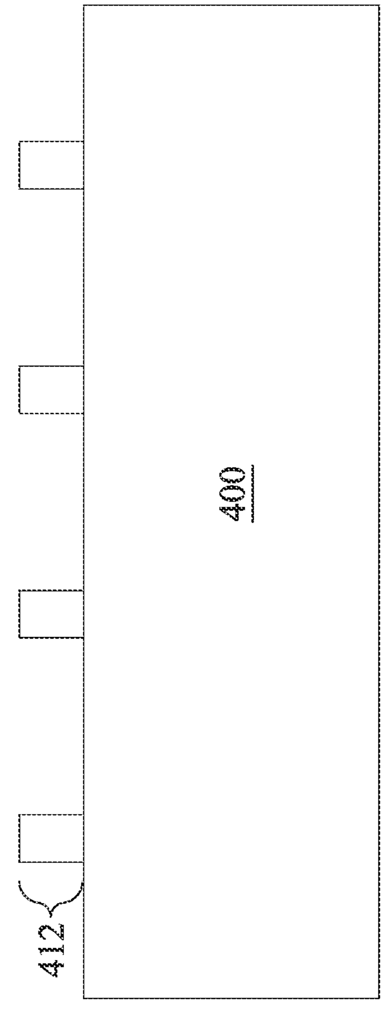
Figure 7:
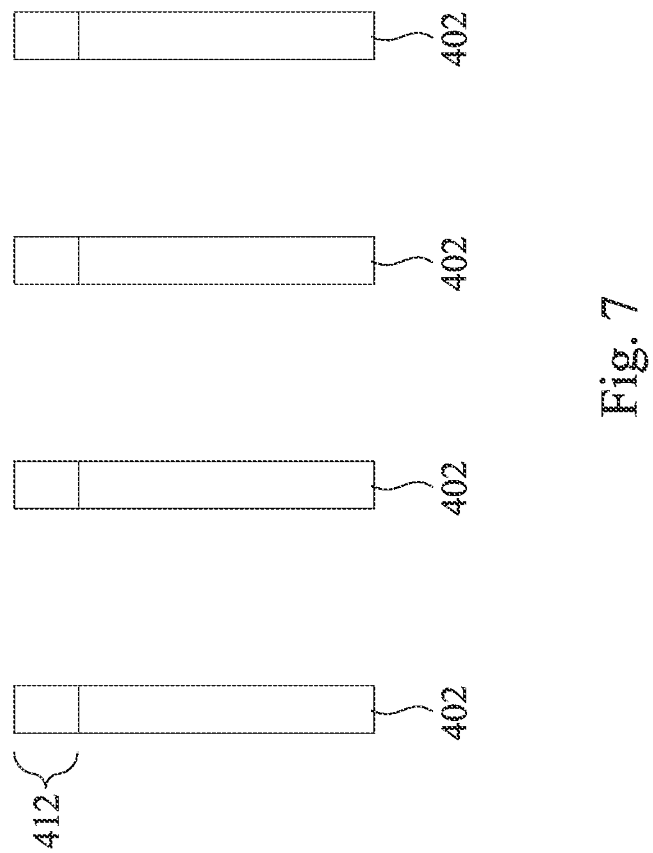

FIGS. 5 through 7 illustrate intermediate stages in an example patterning of a target layer 400 by the semiconductor processing apparatus 100 (see above, FIG. 1). An inspection process may be performed during/after patterning of the target layer 400. The inspection process may be performed by capturing and analyzing images utilizing the camera 102 (see above, FIG. 1).

FIG. 5 illustrates a cross-sectional view of a target layer 400 and a hard mask layer 410 over the target layer 400. The target layer 400 represents a layer in which a pattern is to be formed. As an example, the target layer 400 may be one or more of a semiconductor substrate with or without active/passive devices formed thereon, one or more dielectric layers (e.g., isolation regions, etch stop layers, interlayer dielectric (ILD) layers, inter-metal dielectric (IMD) layers, and/or the like), one or more conductive layers (e.g., metal layers, polysilicon layers, combinations thereof, and/or the like), or the like. The hard mask layer 410 is formed over the target layer 400 and may be formed of a hard mask material. Acceptable hard mask materials include oxides, such as titanium oxide, silicon oxide, a combination thereof, or the like; nitrides, such as titanium nitride, silicon nitride, a combination thereof, or the like; or the like. The material of the hard mask layer 410 may be formed by chemical vapor deposition (CVD), atomic layer deposition (ALD), or the like.

In FIG. 6, the hard mask layer 410 is patterned to form a hard mask 412, which will be subsequently used to pattern the target layer 400. As an example of patterning the hard mask layer 410, a photoresist (not illustrated) is formed over the hard mask layer 410. The photoresist can be formed by using a spin-on technique and can be patterned using acceptable photolithography techniques. In some embodiments, the patterned photoresist is inspected for defects with the camera 102. The patterned photoresist is used as an etching mask to etch and pattern the hard mask layer 410, thus forming a patterned hard mask 412. After patterning the hard mask layer 410, the photoresist is removed, such as by an acceptable ashing process. In some embodiments, the patterned hard mask 412 is inspected for defects with the camera 102. Further processing may be halted if defects are identified during inspection of the patterned photoresist and/or the patterned hard mask 412.

In FIG. 7, the hard mask 412 is used to pattern the target layer 400, thus forming patterned target features 402. The target layer 400 may be patterned by any suitable method, such as a dry or wet etching process using the hard mask 412 as an etching mask. In some embodiments, the patterned target features 402 are inspected for defects with the camera 102. Further processing may be halted if defects are identified during inspection of the patterned target features 402. In some embodiments, the patterned target features 402 are semiconductor fins extending from a semiconductor substrate. In some embodiments, the patterned target features 402 are nanostructures (e.g., nanowires, nanosheets, etc.) over a semiconductor substrate. In some embodiments, the target layer 400 is a dielectric layer, transferring the pattern of the hard mask 412 to the target layer forms trenches and/or openings in the dielectric layer, and the patterned target features 402 are portions of the dielectric layer, between which are the trenches and/or openings in which conductive features (e.g., conductive lines and/or vias) are subsequently formed. In some embodiments, the patterned target features 402 are portions of a conductive layer, having a pattern of metal gates for transistors. In some embodiments, the hard mask 412 is subsequently removed from the patterned target features 402 with a suitable process such as a planarization process (e.g., a chemical-mechanical planarization process), an etching process, or the like.

Figure 8:
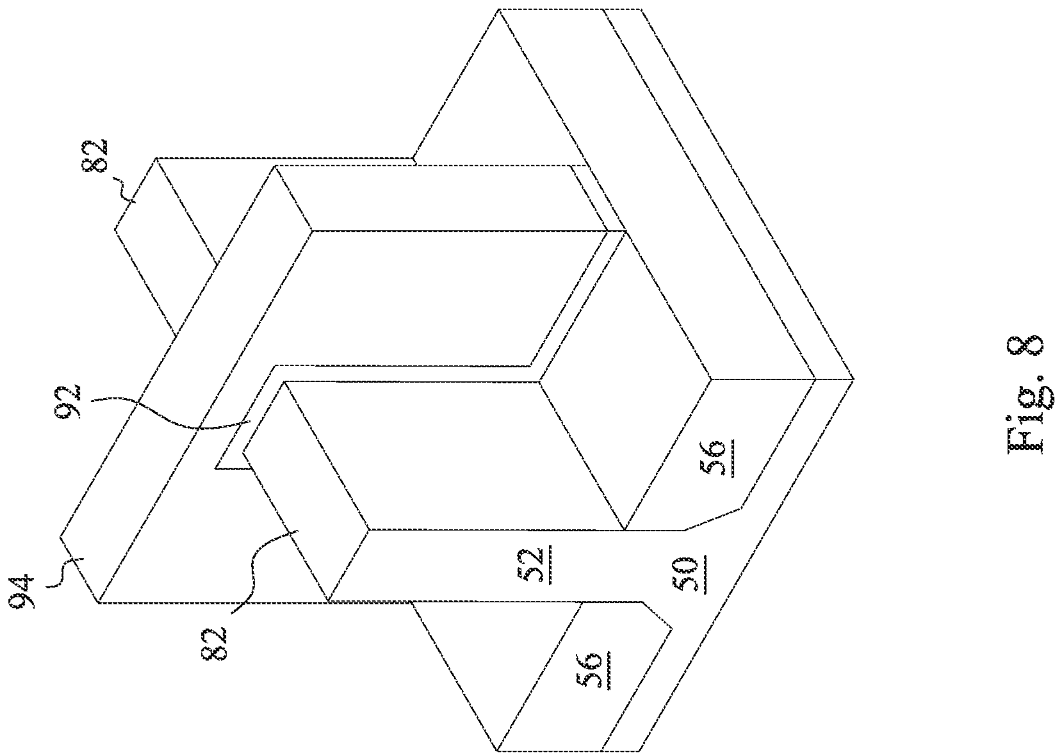
FIG. 8 illustrates an example of a FinFET in a three-dimensional view, in accordance with some embodiments.

FIG. 8 illustrates an example of a FinFET in a three-dimensional view, in accordance with some embodiments. Various features of the FinFET may be formed by patterning processes, such as the process described above in FIGS. 5-7, with test images being captured and examined for defects at one or more intermediate stages of manufacturing. The FinFET comprises a fin 52 on a substrate 50 (e.g., a semiconductor substrate). Isolation regions 56 are disposed over the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56. In some embodiments, the fin 52 is formed by similar methods as the patterned target features 402 as described above with respect to FIGS. 5-7. In some embodiments, the camera 102 is used to inspect the pattern of the fin 52 at one or more intermediate stages of manufacturing.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. In some embodiments, the gate electrode 94 is formed by a gate replacement process including the patterning of dummy gates by similar methods as the patterning of the patterned target features 402 as described above with respect to FIGS. 5-7. In some embodiments, the camera 102 is used to inspect the pattern of the dummy gates at one or more intermediate stages of manufacturing.

Figure 9:
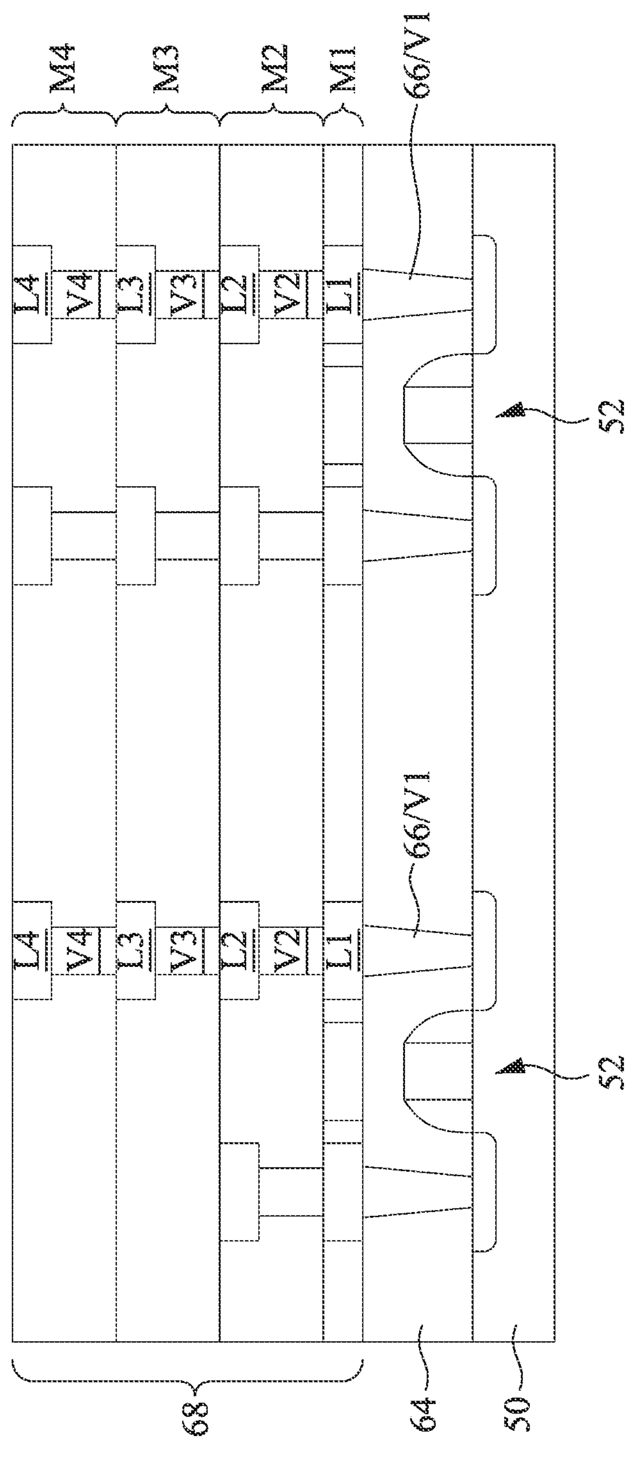
FIG. 9 is a cross-sectional view of a semiconductor device, in accordance with some embodiments.

FIG. 9 illustrates a cross-sectional view of a semiconductor device, in accordance with some embodiments. Various features in FIG. 9 may be formed by patterning processes such as the process described above in FIGS. 5-7, with test images being captured and examined for defects at one or more intermediate stages of manufacturing. FIG. 9 is a simplified view, and some features of the semiconductor device are omitted for clarity of illustration. Devices 62 are formed over a same substrate 50 (e.g., a semiconductor substrate). The devices 62 are formed at the active surface of the substrate 50. The devices 62 may be active devices or passive devices. For example, the electrical components may be transistors, diodes, capacitors, resistors, or the like, formed by any suitable formation method. The devices 62 are interconnected to form, e.g., memory devices and logic devices of the semiconductor device.

One or more inter-layer dielectric (ILD) layer(s) 64 are formed on the substrate 50, and electrically conductive features, such as contact plugs 66, are formed physically and electrically coupled to the devices 62. The electrically conductive features in the ILD layer(s) 64 may be formed through any suitable process, such as deposition, damascene (e.g., single damascene, dual damascene, etc.), the like, or combinations thereof. In some embodiments, the patterning of the ILD layer(s) 64 in order to form the electrically conductive features may be performed by similar methods as the patterning of the patterned target features 402 as described above with respect to FIGS. 5-7. In some embodiments, the camera 102 is used to inspect the pattern of the ILD layer(s) 64 at one or more intermediate stages of manufacturing.

An interconnect structure 68 is formed over the substrate 50, e.g., over the ILD layer(s) 64. The interconnect structure 68 interconnects the devices 62 to form integrated circuits. The interconnect structure 68 includes multiple metallization layers M1-M4. Although four metallization layers are illustrated, it should be appreciated that more or less metallization layers may be included. Each of the metallization layers M1-M4 includes metallization patterns in dielectric layers. The metallization patterns are electrically coupled to the devices 62 of the substrate 50, and include, respectively, conductive lines L1-L4 and vias V1-V4 formed in one or more inter-metal dielectric (IMD) layers. The interconnect structure 68 may formed by a damascene process, such as a single damascene process, a dual damascene process, or the like. In some embodiments, the contact plugs 66 are also part of the metallization patterns, such as part of the lowest layer of metal vias V1. In some embodiments, the patterning of the IMD layers in order to form the conductive lines L1-L4 and vias V1-V4 may be performed by similar methods as the patterning of the patterned target features 402 as described above with respect to FIGS. 5-7. In some embodiments, the camera 102 is used to inspect the pattern of features of the interconnect structure 68 (e.g., the patterns of the IMD layers) at one or more intermediate stages of manufacturing.

Figure 10:
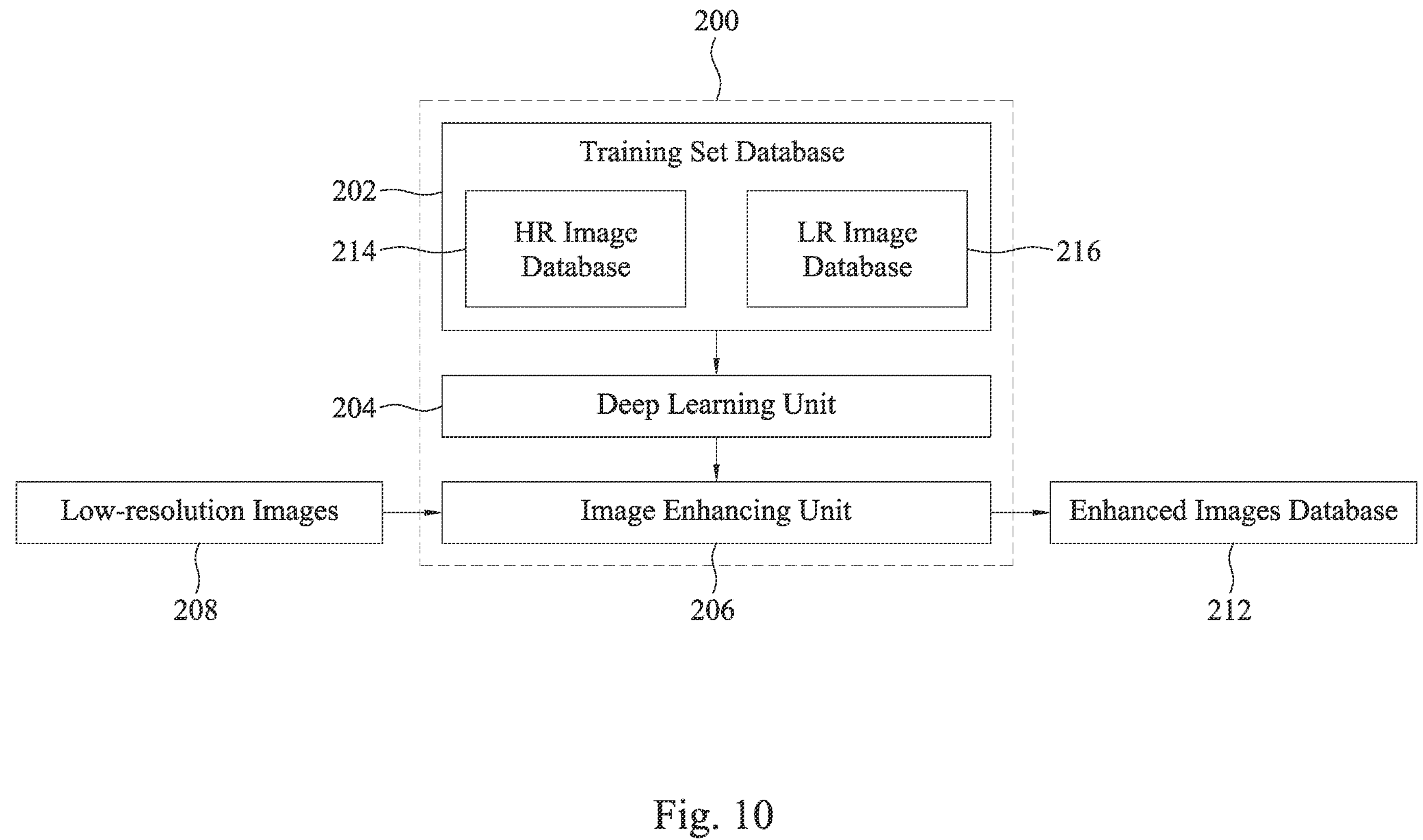
FIG. 10 is a block diagram of an image enhancing system, in accordance with some embodiments.

FIG. 10 is a block diagram of an image enhancing system 200, in accordance with some embodiments. The image enhancing system 200 may be implemented in hardware or software. For example, the image enhancing system 200 may be implemented in software that is executed by the controller 106 (see FIG. 1). The image enhancing system 200 includes a training set database 202, a deep learning unit 204, and an image enhancing unit 206. The image enhancing system 200 is used to enhance low resolution images 140 (see above, FIG. 4A) of regions 302 of a semiconductor wafer 104 in order to better resolve defects 122 (see above, FIG. 4A) in the low resolution images 140 with greater accuracy. Using the image enhancing system 200 to enhance low resolution images 140 for inspection instead of capturing high resolution images 120 for inspection allows for a larger field-of-view (FOV) in the defect inspection process without a corresponding loss in accuracy due to the lower resolution of the images. This reduces process time and increases throughput, reducing manufacturing costs.

In some embodiments, the training set database 202 includes a high resolution image database 214 and a low resolution image database 216. The training set database 202 can be stored in memory on the controller 106. The high resolution image database 214 and the low resolution image database 216 store a plurality of images of one or more semiconductor wafers 104 after particular stages of semiconductor processing. For example, the high resolution image database 214 may store high resolution images 120 (see above, FIG. 4B) of respective regions 302 on one or more semiconductor wafers 104, and the low resolution image database 216 may store corresponding low resolution images 140 (see above, FIG. 3A) of respective regions 302 with larger FOV on the semiconductor wafers 104. The low resolution images 140 in the low resolution image database 216 may have corresponding high resolution images 120 in the high resolution image database 214, with the corresponding high resolution images 120 having a smaller FOV than the low resolution images 140. The images of the training set database 202 are utilized in a machine learning process, as will be described in more detail below.

The deep learning unit 204 utilizes the training set data from the training set database 202 to perform a deep learning process. In particular, the deep learning unit 204 undergoes a machine learning process that utilizes the training set data from the training set database 202 to train the deep learning unit 204 to enhance low resolution images 140 of semiconductor wafers stored in the low resolution (LR) image database 216 based on corresponding high resolution images 120 stored in the high resolution (HR) image database 214. In other words, the deep learning unit 204 utilizes the training set database 202 to learn how to enhance low resolution images 140 of semiconductor wafers to an equivalent resolution of high resolution images 120.

The deep learning unit 204 trains a machine learning model, which is used to enhance low resolution images. The machine learning model may be a generative adversarial network, a convolutional neural network, or the like. In some embodiments, the machine learning model is a generative adversarial network (GAN). The GAN comprises a generator neural network and a discriminator neural network. The generator neural network is operable to upscale low resolution images from the low resolution image database 216 in order to mimic the high resolution images in the high resolution image database 214, and the discriminator neural network is operable to distinguish upscaled images produced by the generator neural network from real images in the high resolution image database 214. During the training process, the generator neural network receives, as input, low resolution images from the low resolution image database 216 and outputs an upscaled image for each low resolution image based on a set of hyperparameters of the machine learning model. Hyperparameters are parameters whose values are used to control the learning process of the machine learning model. The hyperparameters may be, e.g., weighting values associated with neurons of each neural layer of the generator neural network. During training, the discriminator neural network compares each upscaled image generated by the generator neural network to the corresponding real image stored in the high resolution image database 214. The discriminator neural network generates an error function indicating how closely the upscaled image generated by the generator neural network matches the corresponding real image. Feedback from the discriminator neural network is returned to the generator neural network to improve and update the up scaling model of the generator neural network. The deep learning unit 204 then tunes the hyperparameters of the generator neural network, such as by adjusting the weighting values associated with the neurons of each neural layer of the generator neural network. Because the generator neural network generates upscaled images based on the hyperparameters, tuning the hyperparameters will result in the generation of different upscaled images for a same low resolution image. Tuning the hyperparameters can result in the generation of upscaled images that produce larger error functions (indicating worse matching to the real high resolution images) or smaller error functions (indicating better matching to the real high resolution images). After tuning the hyperparameters of the generator neural network, the images are again passed to the discriminator neural network so that upscaled images are again generated and compared to the real high resolution images. The deep learning unit 204 again tunes the hyperparameters of the generator neural network. This process is repeated in a very large number of iterations of tracking error functions and tuning the hyperparameters of the generator neural network until a set of hyperparameters is found that results in upscaled images that match the real high resolution images to a desired degree of accuracy. At the beginning of the training process, the upscaled images which are generated may not match the real high resolution images very closely. However, as the training process proceeds through many iterations of tuning the hyperparameters of the generator neural network, the error functions will trend smaller until a set of hyperparameters is found that results in the generation of upscaled images that match the real high resolution images to a desired degree of accuracy. Identification of a set of hyperparameters that results in matching images, also referred to as an image enhancing model, corresponds to completion of the image enhancing training process. Once the training process is complete, the generator neural network is ready to be used to enhance low resolution images in order to analyze for defects on semiconductor wafers.

An image enhancing unit 206 is then programmed with the image enhancing model, including the hyperparameters of the generator neural network, e.g. the weighting values, to enhance low resolution images. The image enhancing unit 206 is used to enhance low resolution test images 208 captured by the camera 102 (see above, FIG. 1) of regions 302 of the semiconductor wafer 104 (see above, FIG. 3). The enhanced test images are stored in an enhanced image database 212 so that they may be subsequently used for training a defect detection system 300. The image enhancing unit 206 is also used to enhance low resolution images captured of regions 302 of the semiconductor wafer 104 during a subsequent defect inspection process performed by the semiconductor processing apparatus 100 (see below, FIG. 12).

Figure 11:
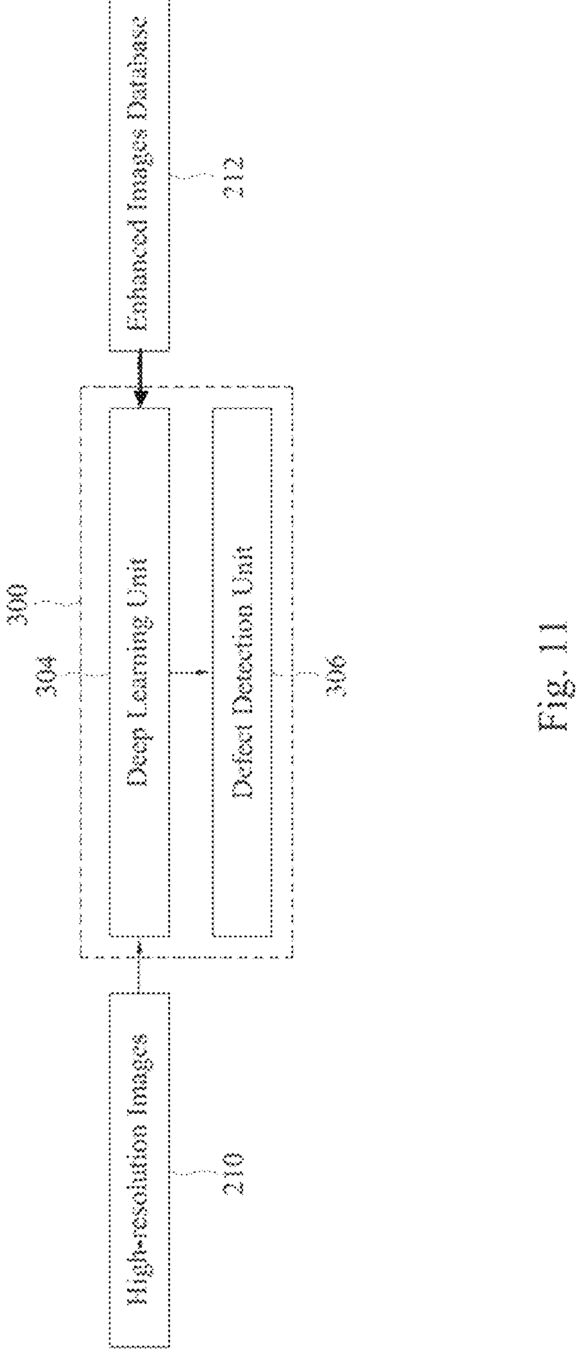
FIG. 11 is a block diagram of a defect detection system, in accordance with some embodiments.

FIG. 11 is a block diagram of a defect detection system 300, in accordance with some embodiments. The defect detection system 300 may be implemented in hardware or software. For example, the defect detection system 300 may be implemented in software that is executed by the controller 106 (see FIG. 1). The defect detection system 300 includes a deep learning unit 304 and a defect detection unit 306. The defect detection system 300 is used to analyze for defects 122 (see above, FIG. 4A) in enhanced images of regions 302 of a semiconductor wafer 104. Using the defect detection system 300 to analyze for defects in enhanced images instead of capturing high resolution images 120 for inspection allows for a larger field-of-view (FOV) in the defect inspection process without a corresponding loss in accuracy due to the lower resolution of the images. This reduces process time and increases throughput, reducing manufacturing costs. The defect detection system 300 is trained using high resolution test images 210 and corresponding enhanced test images from the enhanced images databased 212 produced by the trained image enhancing unit 206 (see above, FIG. 10). The corresponding enhanced test images are those which have overlapping FOVs with the high resolution test images 210.

The deep learning unit 304 trains a machine learning model, which is used to detect defects in an enhanced image. The machine learning model may be a generative adversarial network, a convolutional neural network, or the like. In some embodiments, the machine learning model is a convolutional neural network model. The convolutional neural network model includes multiple layers of neurons. Image data, e.g., high resolution test images 210 and corresponding enhanced test images from the enhanced images database 212, are received in the form of tensors input to the convolutional neural network. A first convolutional layer of neurons processes the image data in accordance with weighing functions and parameters associated with the neurons of the first layer. In particular, the first layer performs convolution operations on the tensors. The result is a series of tensors of reduced dimensions. These tensors of reduced dimensions are then passed to a second convolutional neural layer. The second convolutional neural layer performs convolution operations on the tensors received.

During the training process, the neural network receives, as input, high resolution test images 210 and corresponding enhanced test images from the enhanced images database 212. During the training process, the neural network performs defect recognition on the enhanced test images and the corresponding high resolution test images based on a set of hyperparameters. The hyperparameters may be weighting values associated with neurons of each neural layer of the neural network. During training, the deep learning unit 304 compares defect detection results from the enhanced test images to defect detection results from the corresponding high resolution test images. The deep learning unit 304 generates an error function indicating how closely defect detection utilizing the enhanced test images performs against defect detection utilizing the corresponding high resolution test images. The deep learning unit 304 then tunes the hyperparameters of the neural network. Because the neural network performs defect detection based on the hyperparameters, tuning the hyperparameters will result in different defect detection results for a same enhanced test image. Tuning the hyperparameters can result in defect detection results that produce larger error functions (indicating worse matching with defect detection results from the corresponding high resolution test images) or smaller error functions (indicating better matching with defect detection results from the corresponding high resolution test images). After tuning the hyperparameters of the neural network, the images are again passed to the neural network so that defect recognition is again performed on the enhanced test images and compared against defect recognition results from the corresponding high resolution test images. The deep learning unit 304 again tunes the hyperparameters of the neural network. This process is repeated in a very large number of iterations of tracking error functions and tuning the hyperparameters of the neural network until a set of hyperparameters is found that results in defect detection results from the enhanced test images matching defect detection results from the corresponding high resolution test images to a desired degree of accuracy. At the beginning of the training process, the defect detection results from the enhanced test images may not match the defect detection results from the corresponding high resolution test images very closely. However, as the training process proceeds through many iterations of tuning the hyperparameters of the neural network, the error functions will trend smaller until a set of hyperparameters is found that results in defect detection results from the enhanced test images matching defect detection results from the corresponding high resolution test images to a desired degree of accuracy. Identification of a set of hyperparameters that results in matching defect detection, also referred to as an defect detection model, corresponds to completion of the defect detection training process. Once the training process is complete, the neural network is ready to be used to analyze for defects on semiconductor wafers, and the defect detection unit 306 is then programmed with the defect detection model including the hyperparameters of the neural network, e.g. the weighting values, to analyze for defects using enhanced images of semiconductor wafers.

After the image enhancing system 200 (see above, FIG. 10) and the defect detection system 300 (see above, FIG. 11) have been trained, they are used to determine whether a semiconductor wafer 104 has defects. The camera 102 captures low resolution images of regions 302 of a semiconductor wafer 104. The low resolution images are passed to the image enhancing unit 206 of the trained image enhancing system 200, which enhances the low resolution images in order to increase the subsequent accuracy of identifying defects without decreasing the FOV of the images. The enhanced images are then passed to the defect detection unit 306 of the trained defect detection system 300 in order to analyze the enhanced images and determine whether the respective regions 302 of the semiconductor wafer 104 have defects.

Figure 12:
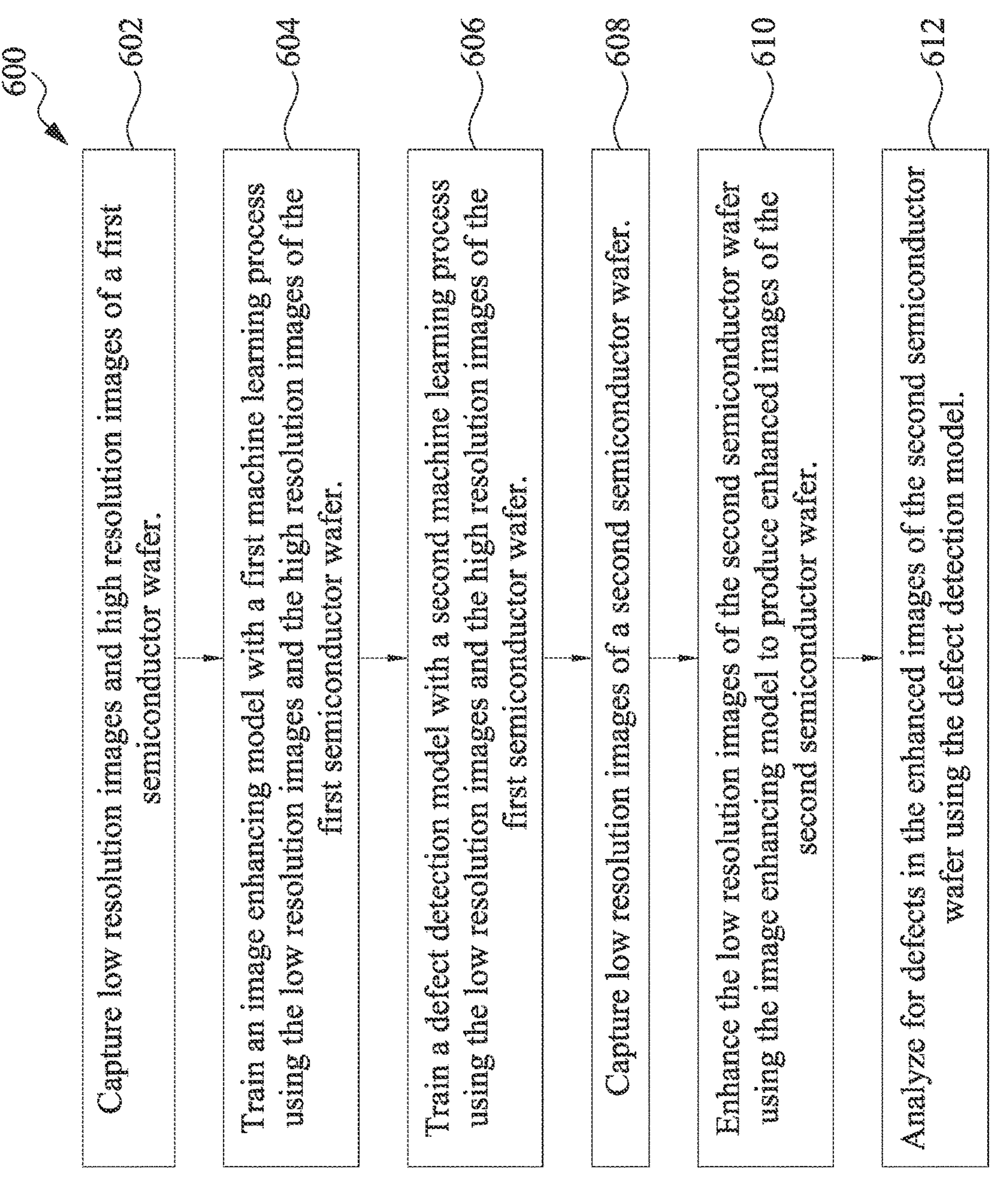
FIG. 12 is a flow chart of a method for detecting defects on a semiconductor wafer, in accordance with some embodiments.

FIG. 12 is a flow chart of a method 600 for detecting defects on a semiconductor wafer. In step 602, a camera 102 captures low resolution images and high resolution images of a first semiconductor wafer 104. In step 604, an image enhancing model is trained with a first machine learning process using the low resolution images and high resolution images of the first semiconductor wafer 104, as described above with respect to FIG. 10. In step 606, a defect detection model is trained with a second machine learning process using the low resolution images and high resolution images of the first semiconductor wafer 104, as described above with respect to FIG. 11. In step 608, the camera 102 captures low resolution images of a second semiconductor wafer 104. In step 610, the low resolution images of the second semiconductor wafer 104 are enhanced using the trained image enhancing model to produce enhanced images of the second semiconductor wafer 104, as described above with respect to FIG. 10. In step 612, defects are analyzed for in the enhanced images of the second semiconductor wafer 104 using the trained defect detection model, as described above with respect to FIG. 11.

Figure 13:
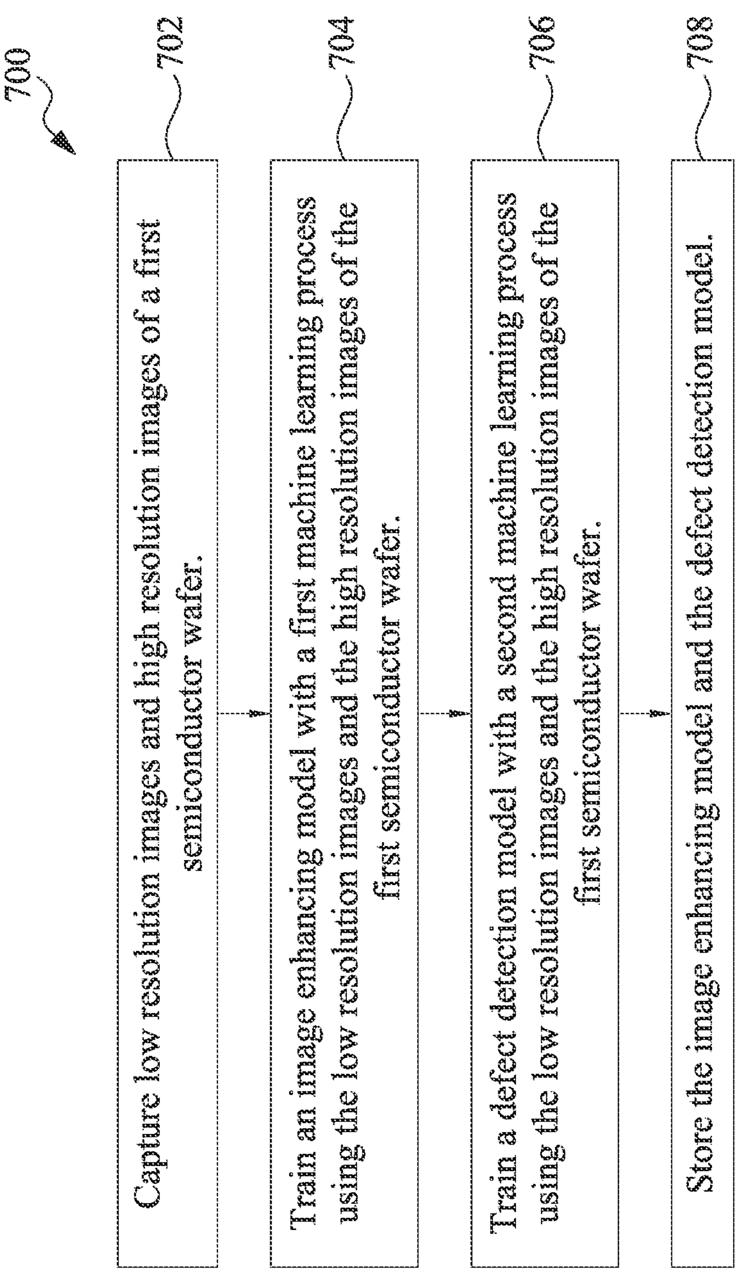
FIG. 13 is a flow chart of a method for training image enhancing and defect detection models with machine learning processes, in accordance with some embodiments.

FIG. 13 illustrates a flow chart of a method 700 for training image enhancing and defect detection models with machine learning processes, in accordance with some embodiments. In step 702, a camera 102 captures low resolution images and high resolution images of a first semiconductor wafer 104. In step 704, an image enhancing model is trained with a first machine learning process using the low resolution images and high resolution images of the first semiconductor wafer 104, as described above with respect to FIG. 10. In step 706, a defect detection model is trained with a second machine learning process using the low resolution images and high resolution images of the first semiconductor wafer 104, as described above with respect to FIG. 11. In step 708, the image enhancing model and the defect detection model are stored (e.g., in memory by a controller 106) for subsequent usage in enhancing low resolution images of semiconductor wafers and identifying defects on the semiconductor wafers using the enhanced images.

Figure 14:
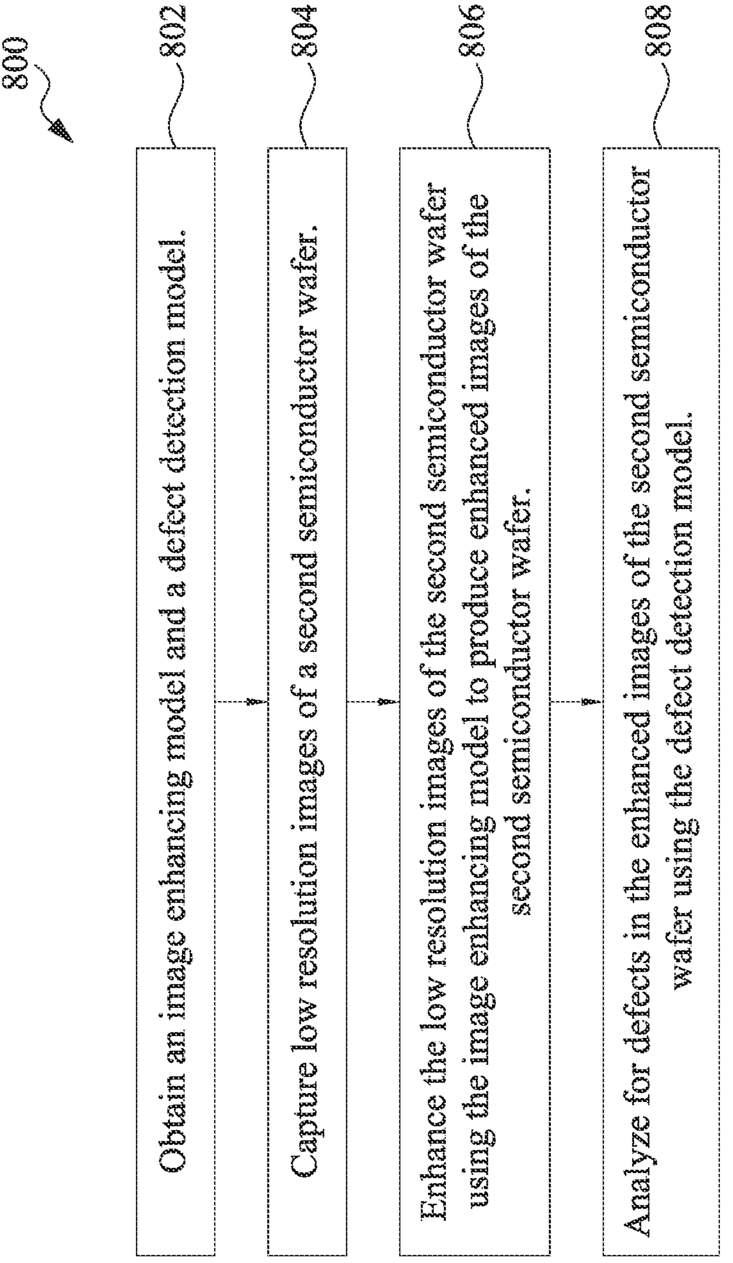
FIG. 14 is a flow chart of a method for detecting defects on a semiconductor wafer using trained image enhancing and defect detection models, in accordance with some embodiments.

FIG. 14 illustrates a flow chart of a method 800 for detecting defects on a semiconductor wafer, in accordance with some embodiments. In step 802, an image enhancing model and a defect detection model are obtained, e.g. from a controlled 106 storing the image enhancing model and a defect detection model in memory. The image enhancing model and the defect detection model may have been previously trained using images of a first semiconductor wafer, as described above for FIG. 13. In step 804, a camera 102 captures low resolution images of a second semiconductor wafer 104. In step 806, the low resolution images of the second semiconductor wafer 104 are enhanced using the image enhancing model to produce enhanced images of the second semiconductor wafer 104, as described above with respect to FIG. 10. In step 808, defects are analyzed for in the enhanced images of the second semiconductor wafer 104 using the defect detection model, as described above with respect to FIG. 11.

Figure 15:
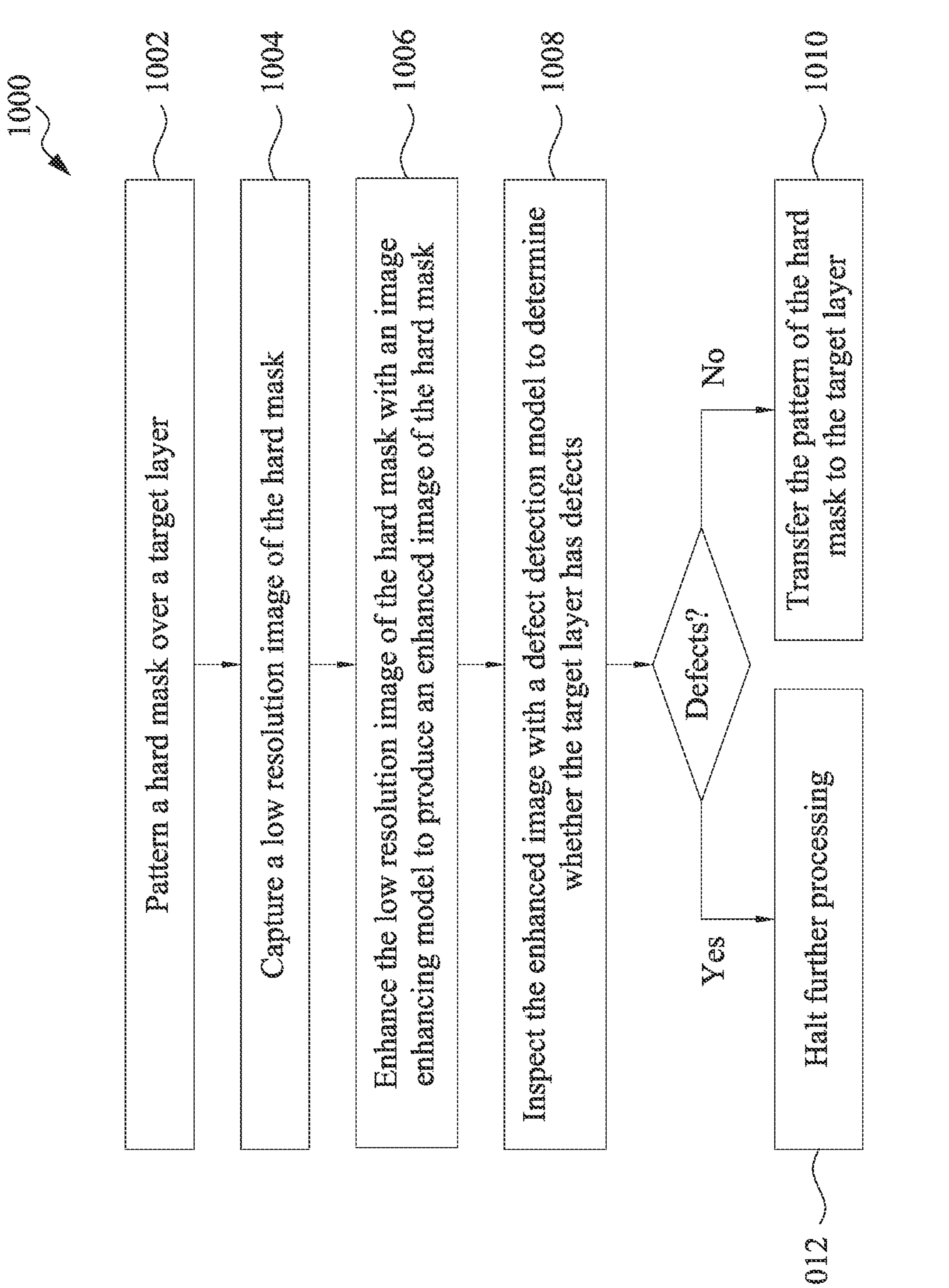
FIG. 15 is a flow chart of a method for patterning a target layer on a semiconductor wafer, in accordance with some embodiments.

FIG. 15 illustrates a flow chart of a method 1000 for patterning a target layer 400 of on a semiconductor wafer 104. In step 1002, a hard mask 412 is patterned over a target layer 400, as illustrated in FIG. 6. In step 1004, a low resolution image of the hard mask 412 is captured by a camera 102. In step 1006, the low resolution image of the hard mask 412 is enhanced with an image enhancing model to produce an enhanced image of the hard mask, as described above with respect to FIG. 10. In step 1008, the enhanced image is analyzed with a defect detection model to determine whether the target layer 400 has defects, as described above with respect to FIG. 11. In step 1010, the pattern of the hard mask 412 is transferred to the target layer 400 in response to the enhanced image indicating that the target layer 400 is free of defects, which produces patterned target features 402 as illustrated in FIG. 7. However, if the enhanced image indicates that the target layer 400 contains defects, then in step 1012, further processing of the semiconductor wafer 104 is halted. The semiconductor wafer 104

(e.g., the hard mask 412) may be reworked to correct the defects, or the semiconductor wafer 104 may be discarded if the defects are irreparable.

Embodiments may provide advantages. A semiconductor processing apparatus uses an image enhancing model to enhance low resolution images of semiconductor wafers in order to inspect the semiconductor wafers for defects. The enhanced images have increased field-of-view (FOV) in the defect inspection process as compared to capturing high resolution images for the defect inspection process, without a corresponding loss in accuracy due to the lower resolution of the images. The larger FOV of the enhanced images used in the defect inspection process decreases the defect inspection time and reduces processing costs by increasing throughput.

In accordance with an embodiment, a method includes: patterning a hard mask over a target layer; capturing a low resolution image of the hard mask; enhancing the low resolution image of the hard mask with a first machine learning model to produce an enhanced image of the hard mask; and analyzing the enhanced image of the hard mask with a second machine learning model to determine whether the target layer has defects. In an embodiment, the method further includes transferring a pattern of the hard mask to the target layer in response to determining the target layer is free of defects. In an embodiment, transferring the pattern of the hard mask to the target layer forms semiconductor fins extending from a semiconductor substrate. In an embodiment, transferring the pattern of the hard mask to the target layer forms openings in a dielectric layer. In an embodiment, the method further includes halting further processing in response to determining the target layer contains defects. In an embodiment, the target layer is part of a first semiconductor wafer, and the method further includes: capturing low resolution images and high resolution images of a second semiconductor wafer, the second semiconductor wafer different from the first semiconductor wafer; and training the first machine learning model and the second machine learning model with the low resolution images and the high resolution images. In an embodiment, the defects are pattern bridging defects in a pattern of the hard mask.

In accordance with another embodiment, a method includes: capturing first low resolution images and first high resolution images of a first semiconductor wafer; training an image enhancing model and a defect detection model with the first low resolution images and the first high resolution images; after training the image enhancing model and the defect detection model, capturing second low resolution images of a second semiconductor wafer; enhancing the second low resolution images of the second semiconductor wafer with the image enhancing model to produce enhanced images of the second semiconductor wafer; analyzing the enhanced images of the second semiconductor wafer with the defect detection model to determine whether the second semiconductor wafer has defects; and performing one or more semiconductor processes on the second semiconductor wafer in response to determining the second semiconductor wafer is free of defects. In an embodiment, the image enhancing model is trained using a generative adversarial network with the first low resolution images and the first high resolution images. In an embodiment, the defect detection model is trained using a convolutional neural network with the first low resolution images and the first high resolution images. In an embodiment, the defects are pattern bridging defects between conductive lines. In an embodiment, the second semiconductor wafer includes a hard mask layer over a substrate, and the method further includes: before capturing the second low resolution images of the second semiconductor wafer, patterning the hard mask layer to form a patterned hard mask. In an embodiment, the second low resolution images are images of the patterned hard mask. In an embodiment, the method further includes transferring a pattern of the patterned hard mask to the substrate. In an embodiment, transferring the pattern of the patterned hard mask to the substrate forms semiconductor fins.

In accordance with yet another embodiment, an apparatus includes: a processing tool configured to perform a semiconductor process on a semiconductor wafer; a camera configured to capture low resolution images of the semiconductor wafer; and a controller configured to: receive the low resolution images of the semiconductor wafer from the camera; enhance the low resolution images of the semiconductor wafer to produce enhanced images of the semiconductor wafer; analyzing the enhanced images of the semiconductor wafer to determine whether the semiconductor wafer has defects; and control the processing tool to perform the semiconductor process in response to determining the semiconductor wafer is free of defects. In an embodiment, the controller is configured to enhance the low resolution images of the semiconductor wafer with a generative adversarial network. In an embodiment, the controller is configured to analyzing the enhanced images of the semiconductor wafer with a convolutional neural network. In an embodiment, the processing tool is configured to pattern a first hard mask over a target layer on the semiconductor wafer. In an embodiment, the controller is configured to control the processing tool to perform the semiconductor process by controlling the processing tool to transfer the pattern of the first hard mask to the target layer in response to determining the semiconductor wafer is free of defects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

patterning a hard mask over a target layer;

capturing a low resolution image of the hard mask;

enhancing the low resolution image of the hard mask with a pre-trained machine learning model to produce an enhanced resolution image of the hard mask, wherein the pre-trained machine learning model is trained by iteratively performing the following steps to generate the enhanced resolution image generating an upscaled image of a low resolution image using a neural network, comparing the upscaled image to a high resolution image corresponding to the low resolution image to generate an error function, tuning parameters of the neural network based on a value of the error function, and regenerating the upscaled image using parameters tuned by the tuning step, and comparing the regenerated upscaled image to the high resolution image corresponding to the low resolution image to regenerate the error function, storing the upscaled image as an enhanced resolution image in an enhanced resolution image database in response to determining the error function is below a pre-determined threshold;

analyzing the enhanced resolution image of the hard mask with a second machine learning model to determine whether the target layer has defects; and transferring the pattern of the hard mask to the target layer to form semiconductor fins extending from a semiconductor substrate.

2. The method of claim 1, further comprising analyzing the enhanced resolution image of the hard mask with a second pre-trained machine learning model to determine whether the target layer has defects, wherein the second pre-trained machine learning model is trained by performing a defect detection analysis on the enhanced resolution image to generate a first result, using a neural network, performing the defect detection analysis on a high resolution image corresponding to the enhanced resolution image to generate a second result, using the neural network, comparing the first result with the second result to generate an error function, tuning parameters of the neural network based upon a value of the error function, re-performing the defect detection analysis on the enhanced resolution image to regenerate the first result, re-comparing the regenerated first result with the second result to regenerate the error function, and completing training of the second pre-trained machine learning model when the regenerated error function has a value below a threshold value.

3. The method of claim 1, further comprising halting further processing in response to determining the target layer contains defects.

4. The method of claim 1, wherein the target layer is part of a first semiconductor wafer, the method further comprising:

capturing low resolution images and high resolution images of a second semiconductor wafer, the second semiconductor wafer different from the first semiconductor wafer; and training the machine learning model and the second machine learning model with the low resolution images and the high resolution images.

5. The method of claim 1, wherein the defects are pattern bridging defects in a pattern of the hard mask.

6. A method comprising:

capturing a first low resolution image and a first high resolution image of a target layer formed on a semiconductor wafer;

training an image enhancing model with the first low resolution image and the first high resolution image, the image enhancing model configured to increase resolution of an image, wherein the image enhancing model is trained by iteratively performing the following steps to generate an enhanced resolution image, generating an upscaled image of the first low resolution image using a neural network, comparing the upscaled image to a high resolution image corresponding to the low resolution image to generate an error function, tuning parameters of the neural network based on a value of the error function, and regenerating the upscaled image using parameters tuned by the tuning step;

after training the image enhancing model, capturing a second low resolution image of a second target layer formed on a second semiconductor wafer;

enhancing the second low resolution image of the second target layer with the image enhancing model to produce an enhanced resolution image of the second target layer;

training a defect detection model with a second high resolution image and the enhanced resolution image of the second target layer, wherein the defect detection model is trained by performing a defect detection analysis on the enhanced resolution image to generate a first result, using a neural network, performing the defect detection analysis on a high resolution image corresponding to the enhanced resolution image to generate a second result, using the neural network, comparing the first result with the second result to generate an error function, tuning parameters of the neural network based upon a value of the error function, re-performing the defect detection analysis on the enhanced resolution image to regenerate the first result, re-comparing the regenerated first result with the second result to regenerate the error function, and completing training of the defect detection model when the regenerated error function has a value below a threshold value;

analyzing the enhanced resolution image of the second target layer with the defect detection model to determine whether the second semiconductor wafer has defects;

performing one or more semiconductor processes on the second target layer in response to determining the second target layer is free of defects; and halting further processing on the second target layer in response to determining the second target layer has defects.

7. The method of claim 6, wherein the step of performing one or more semiconductor processes on the second target layer includes transferring a pattern from a patterned hard mask overlying the second target layer to the second target layer to form semiconductor fins extending from the second semiconductor wafer.

8. The method of claim 6, wherein the defect detection model is trained using a convolutional neural network with the first low resolution images and the first high resolution images.

9. The method of claim 6, wherein the defects are pattern bridging defects between conductive lines.

10. The method of claim 6, wherein the second semiconductor wafer comprises a hard mask layer over a substrate, the method further comprising:

before capturing the second low resolution images of the second semiconductor wafer, patterning the hard mask layer to form the patterned hard mask.

11. The method of claim 10, wherein the second low resolution images are images of the patterned hard mask.

12. The method of claim 11, further comprising transferring a pattern of the patterned hard mask to the substrate by etching the second target layer.

13. An apparatus comprising:
a processing tool configured to perform a semiconductor process on a semiconductor wafer;
a camera configured to capture a low resolution image of a patterned hard mask formed on a target layer over the semiconductor wafer; and
a controller, the controller including computer-readable non-transitory memory containing instructions to:
receive the low resolution images of the patterned hard mask from the camera;
enhance the low resolution image of the hard mask with a machine learning model to produce an enhanced resolution image of the hard mask, wherein the machine learning model is trained by iteratively performing the following steps to generate the enhanced resolution image
generating an upscaled image of a low resolution image using a neural network,
comparing the upscaled image to a high resolution image corresponding to the low resolution image to generate an error function,
tuning parameters of the neural network based on a value of the error function, and
regenerating the upscaled image using parameters tuned by the tuning step, and
comparing the regenerated upscaled image to the high resolution image corresponding to the low resolution image to regenerate the error function,
storing the upscaled image as an enhanced resolution image in an enhanced resolution image database in response to determining the error function is below a pre-determined threshold;
analyze the enhanced resolution images of the semiconductor wafer with a second machine learning model to determine whether the semiconductor wafer has defects; and
control the processing tool to take steps to form fins on the semiconductor wafer in response to determining the semiconductor wafer is free of defects.

14. The apparatus of claim 13, wherein the controller is configured to enhance the low resolution images of the semiconductor wafer with a generative adversarial network.

15. The apparatus of claim 13, wherein the controller is configured to analyze the enhanced resolution images of the semiconductor wafer with a convolutional neural network.

16. The apparatus of claim 13, wherein the processing tool is configured to pattern the hard mask over a target layer on the semiconductor wafer.

17. The apparatus of claim 16, wherein the controller is configured to control the processing tool to perform the semiconductor process by controlling the processing tool to transfer the pattern of the first hard mask to the target layer in response to determining the semiconductor wafer is free of defects.

* * * * *